United States Patent [19]

Koenings et al.

[11] 4,145,458

[45] Mar. 20, 1979

[54] METHOD OF PRODUCING INTERNALLY COATED GLASS TUBES FOR THE DRAWING OF FIBER-OPTIC LIGHT CONDUCTORS

[75] Inventors: Jos Koenings, Eys; Dieter Küppers, Aachen, both of Fed. Rep. of Germany

[73] Assignee: U.S. Philips Corporation, New York, N.Y.

[21] Appl. No.: 834,672

[22] Filed: Sep. 19, 1977

[30] Foreign Application Priority Data

Sep. 24, 1976 [DE] Fed. Rep. of Germany ....... 2642949

[51] Int. Cl.² ............................................. B05D 3/06
[52] U.S. Cl. ...................................... 427/39; 65/3 A; 65/13; 65/60 D; 65/DIG. 7; 427/167
[58] Field of Search ................... 427/38, 39, 166, 167; 65/3 A, 13, 60 D, DIG. 7

[56] References Cited

U.S. PATENT DOCUMENTS

| | | | |
|---|---|---|---|
| 3,655,438 | 4/1972 | Sterling et al. | 427/35 |
| 3,980,459 | 9/1976 | Li | 427/166 |
| 3,982,916 | 9/1976 | Miller | 65/3 A |
| 4,045,198 | 8/1977 | Rau et al. | 65/3 A |

FOREIGN PATENT DOCUMENTS

| | | | |
|---|---|---|---|
| 2063726 | 7/1972 | Fed. Rep. of Germany | 427/39 |
| 50-40116 | 12/1975 | Japan | 427/39 |
| 900263 | 7/1962 | United Kingdom | 427/39 |

*Primary Examiner*—John H. Newsome
*Attorney, Agent, or Firm*—Carl P. Steinhauser

[57] ABSTRACT

The change in the refractive index across the radius which is important for self-focussing fibre optic light conductors is obtained because in the plasma-activated CVD-method the oxygen content of the gas mixture and/or the temperature of the tube wall is continuously reduced during the coating procedure.

3 Claims, 1 Drawing Figure

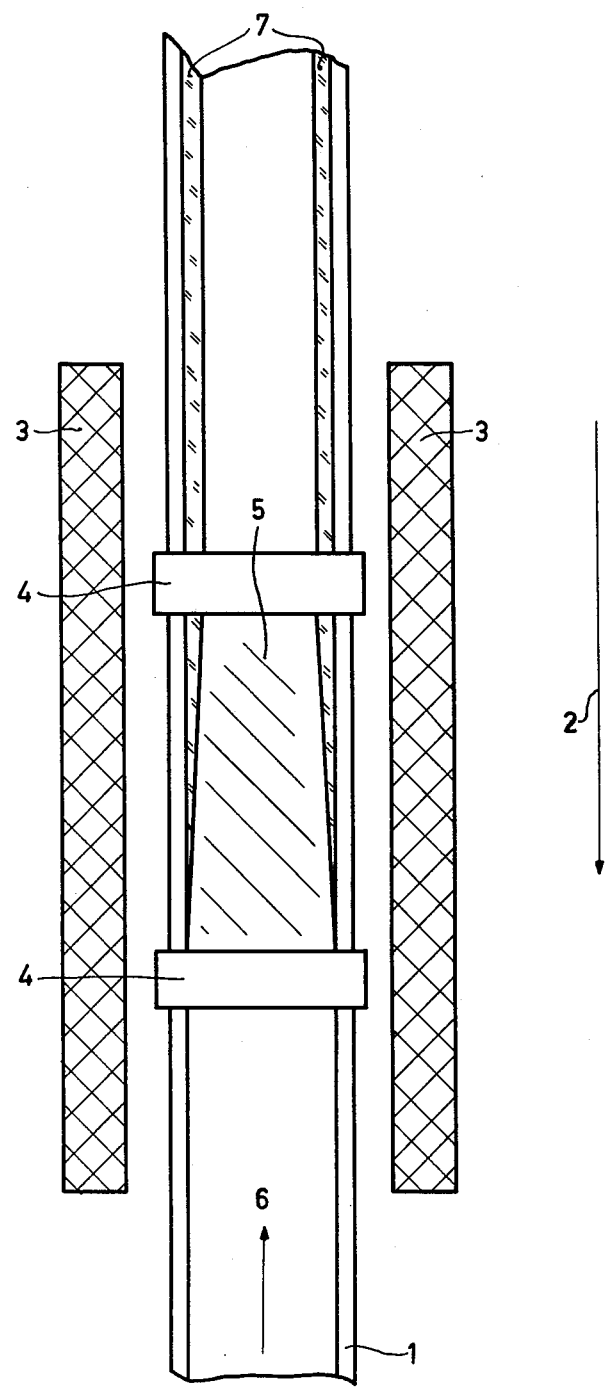

METHOD OF PRODUCING INTERNALLY COATED GLASS TUBES FOR THE DRAWING OF FIBER-OPTIC LIGHT CONDUCTORS

The invention relates to a method of producing internally coated glass tubes for the drawing of fiber-optic light conductors consisting of a core and a jacket of glass having a mutually different refractive index, wherein the coating is deposited from a gas mixture containing only oxygen and a silicon-halogenide which is passed through the tube, a plasma zone being produced in the tube to activate the reactive deposition, a relative motion occurring between the tube and the device which produces the plasma and a temperature zone being super-imposed on the plasma zone.

Such a method is dislosed in DT-OS 24 44 100, this known method will be called furtheron "plasma-activated CVD-method," in which CVD stands for "Chemical Vapour Deposition."

The tubes produced in this manner are softened by heating until they collapse into a rod and thereafter the diameter of the rod is reduced by drawing until a glass fiber is obtained. The light-conducting core is obtained from the internal coating which core is embedded in a cladding of a lower refractive index. The core may, for example, consist of quartz glass which has been doped with a few percents of a metal oxide which increases the refractive index and the cladding (the original glass tube) of undoped quartz glass.

The core of quartz glass may comprise $TiO_2$, $GeO_2$, or $Al_2O_3$ as a doping agent, the cladding may be doped with $B_2O_3$. In self-focusing fiber optical light conductors a parabolic variation in the refractive index across the radius is obtained by means of a continuous change in the amount of doping. According to a known method internally coated quartz glass tubes are produced by passing a gaseous mixture of silicon tetrachloride, a metal chloride (for example titanium tetrachloride, germanium tetrachloride, boron trichloride or aluminum chloride) and oxygen through the tube. In the heating zone the tube is heated to a temperature between 800 and 1200° C. The deposition is done at a pressure of between 1 and 100 Torr. Up to a thousand layers are deposited on top of each other comprising an increasing amount of doping material.

It is an object of the invention to obtain the variation in the refractive index in a simple manner.

In accordance with the invention this object is accomplished by continuously reducing the oxygen content of the gas mixture and/or the temperature of the tube wall during vapour deposition.

It is therefore possible with the method in accordance with the invention to obtain an increase in the refractive index in the plasma-activated CVD-method without the necessity of increasing the doping. To enable this the flow of oxygen which is necessary for a complete reaction is reduced during the deposition reaction

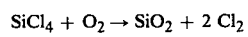

It then appears that the deposited coatings have an increased refractive index which is the greater the more the oxygen supply is reduced. Presumable chloride is taken up in the coatings in the case of an incomplete reaction.

The same effect can be obtained by continuously reducing the wall temperature. It then appears that the refractive index of the deposited $SiO_2$ coatings depends on the wall temperature. The lower this temperature the higher the refractive index of the deposited coatings. In this case the incorporation of chloride could be immediately proved (The Electrochemical Soc., Inc., Chemical Vapour Deposition, Fifth Internal Conference 1975, Paper No. 23, pages 270–280).

In a preferred embodiment of the method according to the invention the oxygen flow is decreased at a constant silicon halogenide flow in the range from 1 to 50 $Ncm^3$/min (normal cubic cm per minute) and at a total pressure in the tube of between 1 and 100 Torr from an originally 5 to 10-fold stoichiometrical excess during the production method to values near or below the stoichiometrically required flow.

With a further preferred embodiment of the method according to the invention the temperature of the tube wall in the range of between 800° and 1200° C. is reduced, during the procedure, by 100 to 200° C., the oxygen flow being 5 to 20-fold the silicon halogenide flow.

By accurately adjusting the oxygen reduction in the time and/or the time temperature variation in the time it is possible to produce "graded index"-profiles having a parabolic variation of the refractive index, which is important for self-focussing fiber-optical light conductors.

In both embodiments of the method according to the invention the device which produces the plasma, for example a resonator, reciprocates along the tube preferably at speeds in the order of magnitude of 5m/min. As then the deposited coatings are thin and very numerous the slight change in the refractive index along a coating is hardly of any importance for the ultimate profile.

An advantage of the method according to the invention is that only a silicon halogenide, for example $SiCl_4$, and $O_2$ are required for producing a graded index fiber and that no doping material is necessary so that the coating process is simplified and cheap.

Of course one is not limited to the system $SiCl_4/O_2$. Also $SiF_4/O_2$ or $SiBr_4/O_2$ etc. can be used. Particularly in the first-mentioned combination a pronounced change in the refractive index is to be expected.

The invention will be explained in greater detail with reference to a drawing and the following examples.

The FIGURE shows diagrammatically an arrangement for performing the method according to the invention.

A tube 1, for example of quartz, is moved through a heating device 3, for example an electric heating coil, in the direction indicated by the arrow 2. Ring-shaped electrodes 4 are disposed within the heating device 3 by means of which a plasma can be produced between the electrodes by applying an a.c. or d.c. voltage in the gas mixture moving in the direction indicated by arrow 6 through the quartz tube 1. A micro-wave resonator may be used instead of the ring-shaped electrodes.

In the reactive deposition a coating 7 is directly formed on the inner wall of the tube 1.

EXAMPLE 1

A constant $SiCl_4$-current of 10 $Ncm^3$/min and an oxygen current which decreases linearly versus the time from 200 $Ncm^3$/min to 30 $Ncm^3$/min is passed for one hour through a quartz tube 1 (lenght 100 cm, outside diameter 8 mm, inside diameter 6 mm) into the direction of the arrow 6. The total pressure in tube 1 was 20 Torr, this pressure was reduced during the process to 12 Torr as the oxygen current was gradually reduced. The wall temperature was kept at 1050° C. An oven 3 and a micro-wave resonator were reciprocated at a speed of 5 m/min along the tube 1, a plasma 5 being produced and a power of 200W was picked up by the resonator from a mains device. A $SiO_2$-coating 7, approximately 300 $\mu$m thick, was directly formed on the tube wall. The relative increase obtained in the refractive index relative to the jacket of pure quartz glass was some parts per thousand.

EXAMPLE 2

Example 1 was repeated in the same arrangement, however, a constant oxygen current of 100 $Ncm^3$/min and a constant $SiCl_4$-current of 10 $Ncm^3$/min being passed through the tube 1. The total pressure in the tube 1 was 20 Torr. During the process, which lasted for approximately 1 hour, the oven temperature was continuously decreased from 1050° C. to 950° C. The change in the relative refractive index was slightly lower as in example 1.

What is claimed is:

1. A method for producing internally coated glass tubes for drawing fiber optical light conductors consisting of a core and a jacket of glasses having a mutually different refractive index, comprising the steps of passing a gas mixture containing only oxygen and a silicon halogenide through the tube to deposit a coating on the wall thereof, producing a plasma zone in the tube for energizing the reactive deposition, moving the tube relative to a device which produces a plasma and superimposes a temperature zone on the plasma zone, and continuously reducing the oxygen content of the gas mixture and/or the temperature of the tube wall while depositing the coating.

2. A method as claimed in claim 1, wherein at a constant silicon halogenide current in the range from 1 to 5 $Ncm^3$/min and at a total pressure in the tube of between 1 and 100 Torr the oxygen current is reduced during the process from an originally 5 to 10-fold stoichiometrical excess to values near or below the stoichiometrical excess to values near or below the stoichiometrically required current.

3. A method as claimed in claim 1 wherein the temperature of the tube wall is reduced during the process in the range of between 800° and 1200° C. by 100° to 200° C., the oxygen current being 5 or 20 times the silicon halogenide current.

* * * * *

UNITED STATES PATENT AND TRADEMARK OFFICE
CERTIFICATE OF CORRECTION

PATENT NO. : 4,145,458
DATED : March 20, 1979
INVENTOR(S) : JOS KOENINGS ET AL

It is certified that error appears in the above-identified patent and that said Letters Patent are hereby corrected as shown below:

Claim 2, Col. 4, line 16, delete the line in its entirety.

Signed and Sealed this

Twenty-third Day of October 1979

[SEAL]

Attest:

RUTH C. MASON
Attesting Officer

LUTRELLE F. PARKER
Acting Commissioner of Patents and Trademarks